United States Patent [19]

Kawamura

[11] Patent Number: 5,500,862

[45] Date of Patent: Mar. 19, 1996

[54] MULTI-LAYER DIGITAL CIRCUIT BOARD WITH A TEST PATTERN SECTION

[75] Inventor: Hajime Kawamura, Tokyo, Japan

[73] Assignee: NEC Corporation, Tokyo, Japan

[21] Appl. No.: 331,174

[22] Filed: Oct. 28, 1994

[30] Foreign Application Priority Data

Oct. 29, 1993 [JP] Japan ................................ 5-272258

[51] Int. Cl.$^6$ ................................................. H04B 17/00
[52] U.S. Cl. ........................................... 371/22.3; 371/27
[58] Field of Search ........................... 371/22.3, 27, 15.1, 371/22.1, 22.5, 22.6; 324/754; 428/137; 361/414, 410, 409; 29/830; 174/68.5

[56] References Cited

U.S. PATENT DOCUMENTS

| | | | |
|---|---|---|---|
| 4,150,421 | 4/1979 | Nishihara et al. | 361/410 |
| 4,299,873 | 11/1981 | Ogihara et al. | 428/137 |
| 4,636,919 | 1/1987 | Itakura et al. | 361/414 |
| 4,700,016 | 10/1987 | Hitchcock et al. | 174/68.5 |
| 4,799,128 | 1/1989 | Chen | 361/414 |
| 4,873,764 | 10/1989 | Grimm | 29/830 |
| 5,399,982 | 3/1995 | Driller et al. | 324/754 |

Primary Examiner—Hoa T. Nguyen
Attorney, Agent, or Firm—Young & Thompson

[57] ABSTRACT

In a digital circuit board comprising a circuit mounting section and a test pattern section, the circuit mounting section has a circuit upper face on which the edge connector and an LSI circuit are mounted. The circuit mounting section has a circuit back face opposite to the circuit upper face. The circuit mounting section has a plurality of terminal through holes, the connector terminals including connector test terminals for use in testing the LSI circuit, and the LSI terminals including LSI test terminals for use in testing the LSI circuit. The terminal through holes have ends connected to the connector test terminals and to the LSI test terminals and have another ends which reach to the circuit back face. The test pattern section has a test upper face which is in contact with the circuit back face and on which test conductive patterns are formed. The test conductive patterns are for use in testing the LSI circuit and connecting the LSI test terminals with the connector test terminals via the terminal through holes. A plurality of LSI circuits may be mounted on the digital circuit board. In the event, the LSI circuit may be both a boundary scan LSI with a boundary scan test logic circuit and an unboundary scan LSI which does not contain the boundary scan test logic circuit.

16 Claims, 4 Drawing Sheets

MULTI-LAYER DIGITAL CIRCUIT BOARD WITH A TEST PATTERN SECTION

BACKGROUND OF THE INVENTION

This invention relates to a multi-layer digital circuit board which enables to test both input and output connections of an electric circuit and, more particularly, to a multi-layer digital circuit board incorporating both a plurality of large scale integrated (LSI) circuits each having a boundary scan test circuit and a plurality of LSI circuits without any boundary scan test circuit.

Three type tests are known as a conventional mass production test of an integrated circuit board with a plurality of LSI circuits. Namely, three type tests are a functional test, an in-circuit test, and a boundary scan test.

Functional test is performed by the following method. When a test vector is fed to the LSI circuits mounted on the integrated circuit board through an edge connector, an output signal (output vector) is produced by the edge connector. It is confirmed whether or not all of input/output terminals of the LSI circuits are properly connected to peripheral circuit by comparing the output signal value (output vector value) with an expected value.

In-circuit test uses an apparatus comprising test pattern feed/read pins. Test between the feed pins and the read pins is performed by connecting the apparatus to terminals or via holes on a circuit element. In-circuit testing technique generally involves the application of a preselected digital pattern to the input of an individual circuit element, a so-called device under test (DUT), and the comparison of the DUT response to an excepted response.

Boundary scan test uses at least one LSI circuit comprising buffers corresponding to each of input/output terminals, test data buses which connect in series buffers, and test logic circuits. Boundary scan test technique enables to perform connection test among a plurality of the LSI circuits without considering the inside of the LSIs.

However, above-mentioned three types of digital circuit test techniques have following problems.

In functional test, it is particularly difficult to design a test vector which raises detection to failure ratio.

In in-circuit test, it is economically and physically difficult to prepare the apparatus which enables to cover all detecting points.

In boundary scan test, since cost for containing test logic circuits in the LSI circuits is high, it is difficult to apply boundary scan test technique to all LSI circuits mounted on the digital circuit board.

SUMMARY OF THE INVENTION

It is therefore an object of this invention to provide a multi-layer digital circuit board which easily enables to perform test of an LSI mounted thereon.

According to an aspect of this invention, a multi-layer digital circuit board for mounting an edge connector has a plurality of connector terminals and a large-scale integrated (LSI) circuit having a plurality of LSI terminals. The multi-layer digital circuit board comprises a circuit mounting section having a circuit upper face on which the edge connector and the LSI circuit are mounted. The circuit mounting section has a circuit back face opposite to the circuit upper face. The circuit mounting section has a plurality of terminal through holes, the connector terminals including connector test terminals for use in testing the LSI circuit, and the LSI terminals including LSI test terminals for use in testing the LSI circuit. The terminal through holes have ends connected to the connector test terminals and to the LSI test terminals and having another ends which reach to the circuit back face. The multi-layer digital circuit board further comprises a test pattern section having a test upper face which is in contact with the circuit back face and on which test conductive patterns is formed. The test conductive pattern is for use in testing the LSI circuit. The test conductive pattern connects the LSI test terminals with the connector test terminals via the terminal through holes.

DESCRIPTION OF THE PREFERRED EMBODIMENT

Figure 1:
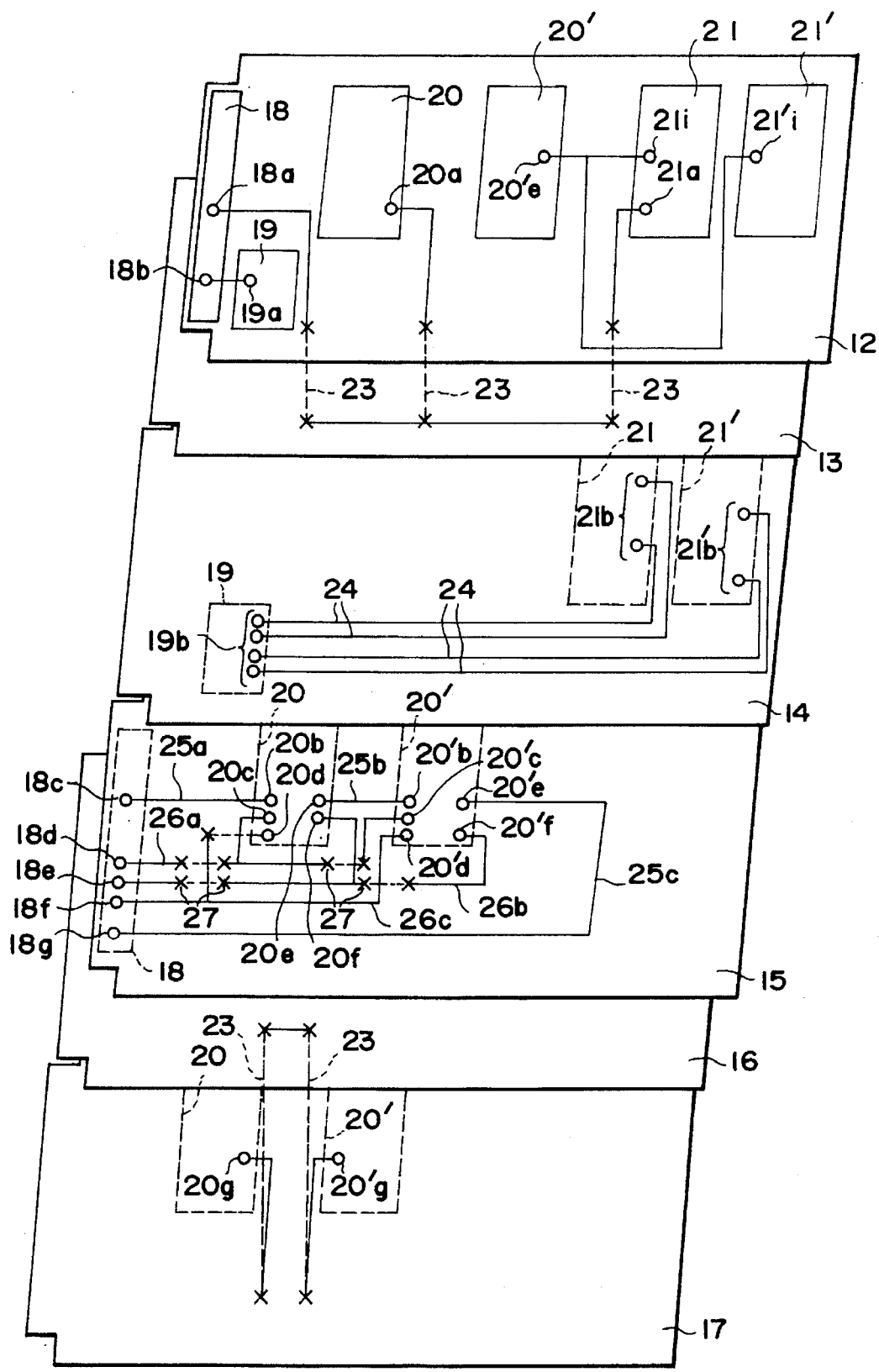
FIG. 1 is a diagram showing constitution of a multi-layer digital circuit board according to an embodiment of this invention.

Referring to FIG. 1, the description will proceed to a multi-layer digital circuit board according to a preferred embodiment of the present invention. In FIG. 1, a digital circuit board comprises a first surface layer 12, a first normal signal wiring layer 13, a first test signal wiring layer 14, a second test signal wiring layer 15, a second normal signal wiring layer 16, a second surface layer 17.

A combination of the first surface layer 12 and the first normal signal wiring layer 13 serves as a circuit mounting section. A combination of the first test signal wiring layer 14 and the second test signal wiring layer 15 serves as a test pattern section. The first test signal wiring layer 14 is called a fist test pattern layer. The second test signal wiring layer 15 is called a second test pattern layer. A combination of the second normal signal wiring layer 16 and the second surface layer 17 serves as a normal pattern section.

On the first surface layer 12 are mounted an edge connector 18, a parallel-serial converter 19, first and second boundary scan LSI circuits 20 and 20' each having a boundary scan test logic circuit (not shown), and first and second unboundary scan LSI circuits 21 and 21' each of which does not mount a boundary scan test logic circuit. The first boundary scan LSI circuit 20 has a first and second normal signal terminal 20a and 20g, a first test input LSI terminal 20b, a first clock input LSI terminal 20c, a first reset input LSI terminal 20d, a first test result output LSI terminals 20e, a first mode input LSI terminal 20f. The second boundary scan LSI circuit 20' has a second test input LSI terminal 20'b, a second clock input LSI terminal 20'c, a second reset input LSI terminal 20'd, a second test result output LSI terminal 20'e, a second mode input LSI terminal 20'f, and a third normal signal terminal 20'g. The input LSI terminals 20c, 20'c, 20d, 20'd, 20f, and 20'f serve as test control input terminals. The first unboundary scan LSI circuit 21 has a normal signal terminals 21a, a first test output terminal 21b, a first test input terminal 21i. The second unboundary scan LSI circuit 21' has a second test output terminal 21'b, a second test input terminal 21'i. The parallel-serial converter 19 has an output converter terminal 19a, and input converter terminals 19b. The edge connector 18 has a normal signal terminal 18a and an output connector terminal 18b. The normal signal terminals 20a and 21a are connected to the normal signal terminal 18a via through holes 23. The second normal signal terminal 20g is connected to the third normal signal terminal 20'g via the through holes 23.

Figure 2:
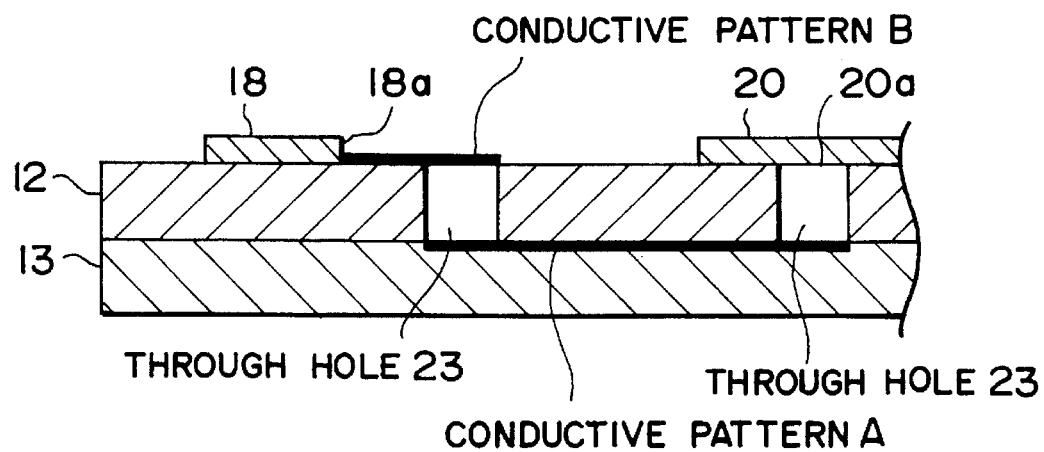
FIG. 2 is a diagram for use in describing through holes for use in the multi-layer digital circuit board illustrated in FIG. 1.
Figure 6:
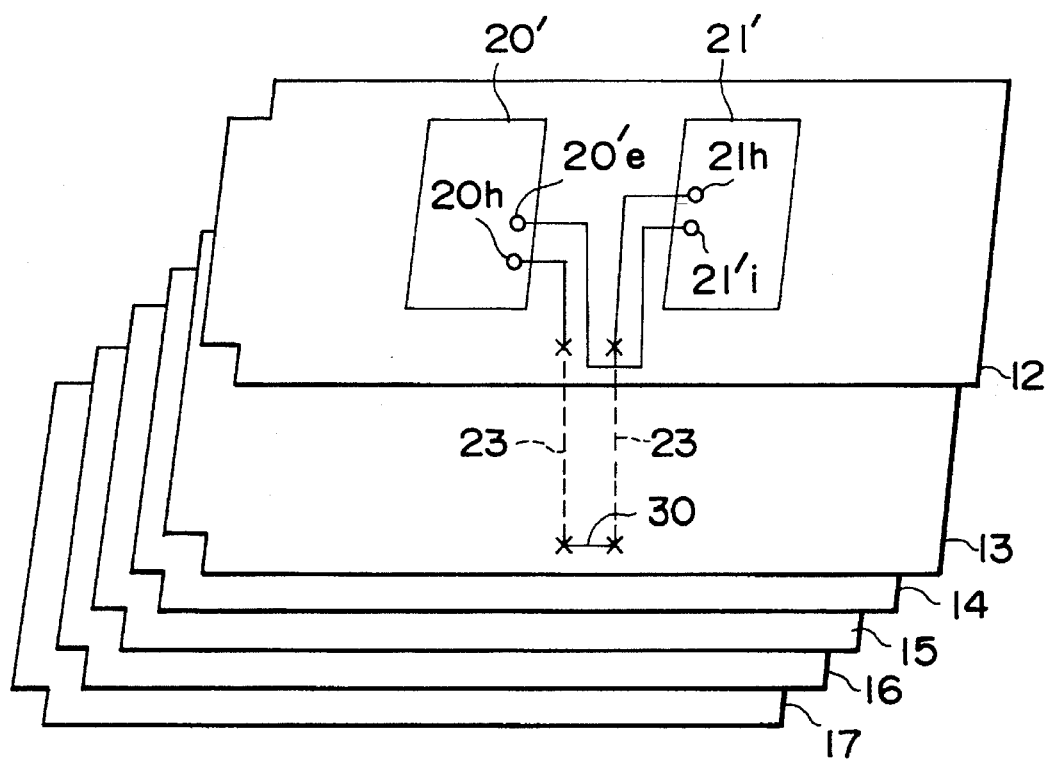
FIG. 6 is a diagram showing another wiring structure on the surface layer illustrated in FIG. 4.

Referring to FIG. 2 in addition to FIG. 1, the description will be made as regards the through holes 23. In FIG. 6, the normal signal terminal 20a is connected to a conductive pattern A on the first normal signal wiring layer 13 through the through hole 23. The conductive pattern A is connected to a conductive pattern B on the first surface layer 12 through the through hole 23. The conductive pattern B is connected to the normal signal terminal 18a. Accordingly, even if there are many input terminals and many output terminals on the first surface layer 12, it is possible to wire so as not to short-circuit among a plurality of conductive patterns.

Figure 3:
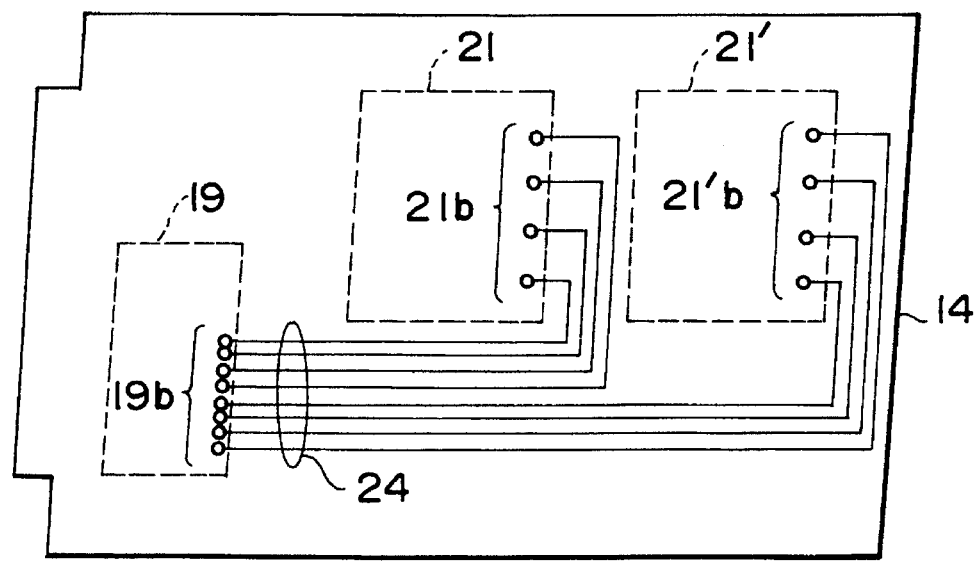
FIG. 3 is a diagram showing wiring structure on a first test pattern layer for use in the multi-layer digital circuit board illustrated in FIG. 1.

Referring to FIG. 3 in addition to FIG. 1, the description will be made as regards the wiring on the first test signal wiring layer 14. As shown in FIG. 3, the first unboundary scan LSI circuit 21 has the first test output terminals 21b which are equal in number to four. The second unboundary scan LSI circuits 21' has the second test output terminals 21'b which are equal in number to four. The parallel-serial converter 19 has the input converter terminals 19b which are equal in number to eight. The input converter terminals 19b are connected to the first test output terminals 21b and the second test output terminals 21'b via resultant signal patterns 24 which are equal in number to eight. Each of the first and the second test output terminals 21b and 21'b may not be equal in number to four. In this event, the number of the input converter terminals 19b and the resultant signal patters 24 varies corresponding to the number of the first and the second test output terminals 21b and 21'b. The second test result output LSI terminal 20'e is connected to the first test input terminal 21i and the second test input terminal 21'i. Conductive patterns which connect among the terminals 20'e, 21i, and 21'i are wiring on the first surface layer 12. Accordingly, short never happen by using the plurality of through holes 23.

Figure 4:
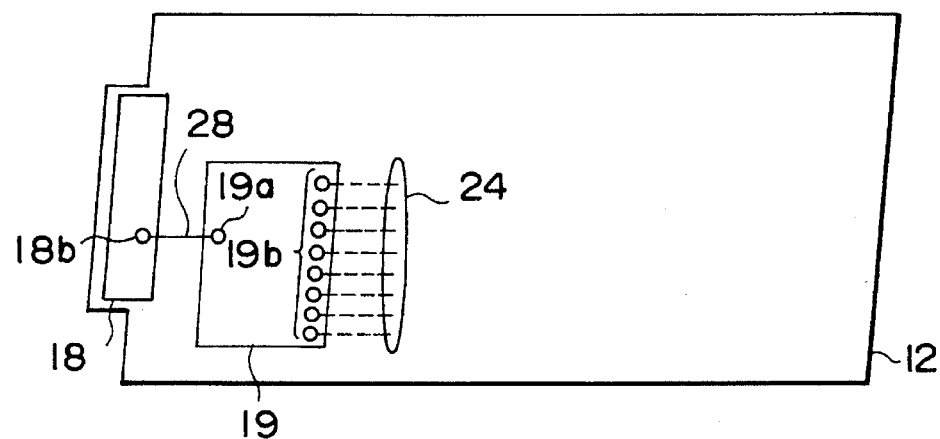
FIG. 4 is a diagram showing wiring structure on a surface layer for use in the multi-layer digital circuit board illustrated in FIG. 1.

FIG. 4 is a block diagram for use in describing wiring between the edge connector 18 and the parallel-serial converter 19 on the first surface layer 12. As shown in FIGS. 3 and 4, the first and the second test output terminals 21b and 21'b and the input converter terminals 19b are formed on the first test signal wiring layer 14. On the other hand, the input converter terminals 19b and the output connector terminal 18b are formed on the first surface layer 12. The edge connector 18 is connected to a test machine (not shown) on testing. The resultant signal patterns 24 are also used to transmit a plurality of normal signals which are produced by the first and the second unboundary scan LSI circuit 21 and 21'.

Figure 5:
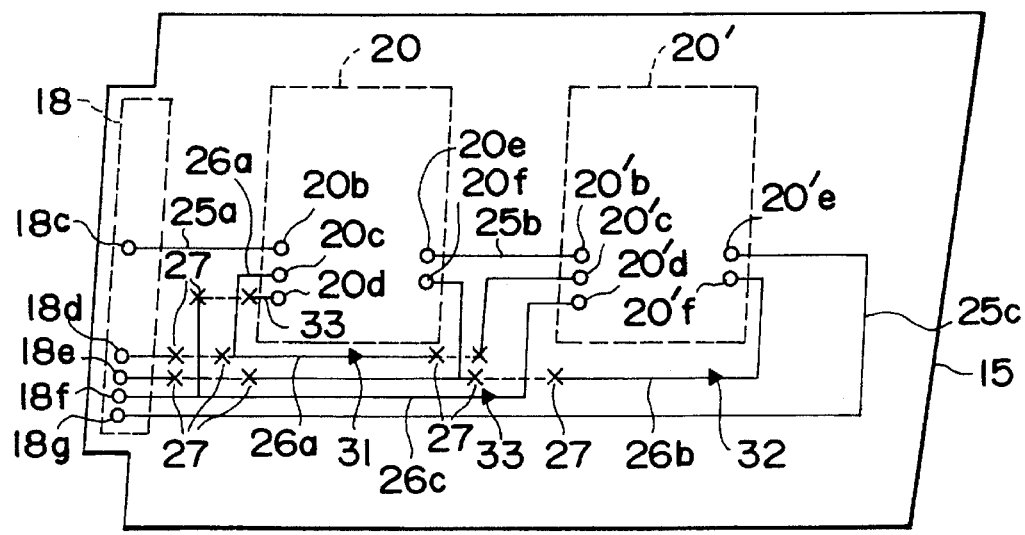
FIG. 5 is a diagram showing wiring structure on a second text pattern layer for use in the multi-layer digital circuit board illustrated in FIG. 1.

Referring to FIG. 5 in addition to FIG. 1, the description will be made as regards the wiring on the second test signal wiring layer 15. In FIG. 5, the edge connector 18 has an input connector terminal 18c, a clock input connector terminal 18d, a mode input connector terminal 18e, and a reset input connector terminal 18f, and a test result output connector terminal 18g. The input connector terminals 18d, 18e, and 18f serve as test control input terminals. The unput connector terminal 18c is connected to the first test input LSI terminal 20b via a test input conductive pattern 25a. The first test result output LSI terminal 20e is connected to the second test input LSI terminal 20'b via a test input conductive pattern 25b. The second test result output LSI terminal 20'e is connected to the test result output connector terminal 18g via a test output conductive pattern 25c. The clock input connector terminal 18d is connected to the first and the second clock input LSI terminals 20c and 20'c via a clock conductive pattern 26a. The mode input connector terminal 18e is connected to the first and the second mode input LSI terminals 20f and 20'f via a mode conductive pattern 26b. The reset input connector terminal 18f is connected to the first and the second reset input LSI terminals 20d and 20'd via a reset conductive pattern 26c. In FIG. 1 and FIG. 5, marks denoted by "X" are blind via holes 27. The blind via holes 27 are through holes formed in the first test signal wiring layer 14. Broken lines are the clock conductive patterns 26a and 26b wired on the second normal signal wiring layer 16. Thus, the test control input terminals 18d, 18e, and 18f are connected to the test control input terminals 20c, 20'c, 20d, 20'd, 20f, and 20'f through the blind via holes 27 via the second normal signal wiring layer 16. Accordingly, it is possible to wire so as not to short-circuit among a plurality of test control signal conductive patterns.

As shown in FIG. 1, the first boundary scan LSI circuit 20 and the first unboundary scan LSI circuit 21 have the normal signal terminals 20a and 21a which are connected to the normal signal terminal 18a of the edge connector 18 via the through hole 23. However, as shown in FIG. 6, the boundary scan LSI circuit 20 and the first unboundary scan LSI circuit 21 may have another normal signal terminals 20h and 21h which are connected to each other via the through holes 23 and a wiring pattern 30 formed on the first normal signal wiring layer 13 without connecting the edge connector 18. Conductive pattern connecting the terminal 20'e and the terminal 20'i may be wired via the first normal signal wiring layer 13.

The first surface layer 12, the first normal signal wiring layer 13, the first test signal wiring layer 14, the second test signal wiring layer 15, the second normal signal wiring layer 16, and the second surface layer 17 have first through sixth upper faces and first through sixth back faces, respectively. The second upper face is in contact with the first back face. The third upper face is in contact with the second back face. The fourth upper face is in contact with the third back face. The fifth upper face is in contact with the fourth back face. The sixth upper face is in contact with the fifth back face.

Referring to FIGS. 1 and 3, the method of automatic test as regards both the unboundary scan LSI circuits 21 and 21' and the boundary scan LSI circuits 20 and 20' in the structure as above will be described.

Referring to FIGS. 1 and 5, the method of boundary scan test as regards the boundary scan LSI circuits 20 and 20' in the structure as above will be described. The test machine (not shown) is connected to the edge connector 18. The test machine produces a mode signal 32 indicative of one of a test mode and a normal mode. The mode signal 32 is supplied to the first and the second mode input LSI terminals 20f and 20'f through the mode input connector terminal 18e. When the mode signal 32 is supplied to those, the boundary scan test logic circuit (not shown) is put into the test mode. Subsequently, the test machine produces a reset signal 33 indicative of reset of the boundary scan LSI circuits 20 and 20'. The reset signal 33 is supplied to the first and the second reset input LSI terminals 20d and 20'd through the reset input connector terminal 18f. When the reset signal 33 is supplied to those, the boundary scan test logic circuit (not shown) is reset.

Subsequently, the test machine produces a clock signal. The clock signal 31 is supplied to the first and the second clock input LSI terminals 20c and 20'c through the clock input connector terminal 18d. When the clock signal 31 is supplied to those, a test pattern signal indicative of test pattern is produced by the test machine in synchronism with the clock signal 31. The test pattern comprises at least one test pattern. The test pattern signal is supplied to the first and the second test input LSI terminals 20b and 20'b through the input connector terminal 18c. When the test pattern signal is supplied to those, a test result signal responsive to the test pattern signal is produced by the first and the second test result output LSI terminals 20e and 20'e. The test result signal is indicative of test result comprised at least one test result. The test result signal is supplied to the test machine through the test result output connector terminal 18g.

Inasmuch as the second test result output LSI terminal 20'e is connected to the first and the second test input terminals 21i and 21'i, the test pattern signal from the test machine is also supplied to the first and the second test input terminals 21i and 21'i. When the test pattern signal is also supplied to those, resultant data indicative of test result responsive to the test pattern signal is produced by the first and the second test output terminals 21b and 21'b. Simultaneously, the resultant data is supplied to the input converter terminal 19b via the resultant signal patterns 24.

Before the test pattern signal is supplied, logic simulation is performed on a logic simulation model of the unboundary scan LSI circuits 21 and 21'. Thereafter, an expected value which was obtained as a result of the logic simulation is stored in a memory (not shown) in the test machine. The resultant data is compared with the expected value, Accordingly, it is possible to check whether all the input/output terminals of the unboundary scan LSI circuits 21 and 21' are perfectly soldered. This test is so-called functional test.

As described above, according to the present invention, it is possible to perform mass production tests of integrated circuit boards with a plurality of LSIs.

In addition, inasmuch as the integrated circuit board is multi-layer type composed of six layer, and as the first wiring layer 14 for the functional test and the second wiring layer 15 for the boundary scan test are independently constituted each other, it is possible to perform simultaneously both the boundary scan test in the first and the second boundary scan LSI circuits 20 and 20' with boundary scan test circuit and the functional test in the first and the second unboundary scan LSI circuits 21 and 21' which do not mount boundary scan test circuits.

While this invention has thus far been described in conjunction with the preferred embodiments thereof, it will now readily be possible for those skilled in the art to develop various other embodiments of this invention. For example, when the number of the conductive patterns is not many, the multi-layer digital circuit boards is capable of constituting of four layers composed by the first surface layer, the second surface layer, the first test signal wiring layer, and the second test signal wiring layer. When the number of the conductive patterns is many and complicated, the multi-layer digital circuit board may constitute of eight layers composed by the first surfaced layer, the second surface layer, first through fourth normal signal line wiring layers, the first test signal wiring layer, and the second test signal wiring layer. Accordingly, although the number of the conductive patterns varies, it is possible to wire without short-circuit among the conductive patterns by varying the number of layers.

What is claimed is:

1. A multi-layer digital circuit board for mounting an edge connector having a plurality of connector terminals and a large-scale integrated (LSI) circuit having a plurality of LSI terminals, comprising:

an edge connector having a plurality of connector terminals;

a large-scale integrated (LSI) circuit having a plurality of LSI terminals;

a circuit mounting section having a circuit upper face on which the edge connector and the LSI circuit are mounted, said circuit mounting section having a circuit back face opposite to the circuit upper face, said circuit mounting section having a plurality of terminal through holes, the connector terminals including connector test terminals for use in testing the LSI circuit, and the LSI terminals including LSI test terminals for use in testing the LSI circuit, the terminal through holes having ends connected to the connector test terminals and to the LSI test terminals and having other ends which reach to the circuit back face; and a test pattern section having a test upper face which is in contact with the circuit back face and on which test conductive patterns are formed, the test conductive patterns being for use in testing the LSI circuit and connecting the LSI test terminals with the connector test terminals via the terminal through holes.

2. A multi-layer digital circuit board as claimed in claim 1, wherein said LSI circuit is a boundary scan LSI circuit containing a boundary scan test logic circuit.

3. A multi-layer digital circuit board as claimed in claim 2, wherein said connector test terminals comprises a test input connector terminal for receiving a test pattern signal for use in testing the boundary scan LSI circuit, a clock input connector terminal for receiving a clock signal, a reset input connector terminal for receiving a reset signal indicative of reset of the boundary scan LSI, a mode input connector terminal for receiving a mode signal indicative of one of a test mode and a normal mode, and a test result output connector terminal for producing a test result signal indicative of a test result of the boundary scan LSI circuit;

said LSI test terminals comprising a test input LSI terminal for receiving the test pattern signal, a clock input LSI terminal for receiving the clock signal, a reset input LSI terminal for receiving the reset signal, a mode input LSI terminal for receiving the mode signal, and a test result output LSI terminal for producing the test result signal; and said test conductive patterns comprising a test input conductive pattern for connecting the test input connector terminal with the test input LSI terminal, a clock conductive pattern for connecting the clock input connector terminal with the clock input LSI terminal, a reset conductive pattern for connecting the reset input connector terminal with the reset input LSI terminal, a mode conductive pattern for connecting the mode input connector terminal with the mode input LSI terminal, and a test output conductive pattern for connecting the test result output connector terminal with the test result output LSI terminal.

4. A multi-layer digital circuit board as claimed in claim 1, wherein said LSI circuit is an unboundary scan LSI circuit without a boundary scan test logic circuit.

5. A multi-layer digital circuit board as claimed in claim 4, wherein said circuit mounting layer further mounts a parallel-serial converter on the circuit upper face, the parallel-serial converter having input converter terminals and an output converter terminal;

said connector test terminals including an input connector terminal for receiving a test pattern signal for use in testing the unboundary scan LSI circuit and an output connector terminal connected to the output converter terminal;

said circuit mounting layer having a plurality of additional through holes which have ends connected to the input converter terminals and other ends which reach to the circuit back face;

said LSI test terminals comprising a test input terminal connected to the input connector terminal and test output terminals for producing resultant data indicative of a test result of the unboundary scan LSI circuit; and said test conductive patterns comprising resultant signal patterns connecting the input converter terminals with the testy output terminals via the additional through holes.

6. A multi-layer digital circuit board for mounting an edge connector having a plurality of connector terminals and a plurality of large-scale integrated (LSI) circuits each having a plurality of LSI terminals, comprising:

an edge connector having a plurality of connector terminals; a plurality of LSI circuits having a plurality of LSI terminals;

a circuit mounting section having a circuit upper face on which the edge connector and the LSI circuits are mounted, said circuit mounting section having a circuit back face opposite to the circuit upper face, said circuit mounting section having a plurality of terminal through holes, the connector terminals including connector test terminals for use in testing the LSI circuit, the LSI terminals including LSI test terminals for use in testing the LSI circuits, the terminal through holes having ends connected to the connector test terminals and to the LSI test terminals and having other ends which reach to the circuit back face; and a test patter section having a test upper face which is in contact with the circuit back face and on which test conductive patterns are formed, the test conductive patterns being for use in testing the LSI circuits and connecting the LSI test terminals with the connector test terminals via the terminal through holes.

7. A multi-layer digital circuit board as claimed in claim 6, wherein said LSI circuits comprises first through N-th boundary scan LSI circuits each containing a boundary scan test logic circuit, where N represents a natural number which is not less than two.

8. A multi-layer digital circuit board as claimed in claim 7, wherein said connector test terminals comprise a test input connector terminal for receiving a test pattern signal for use in testing the boundary scan LSI circuits, a clock input connector terminal for receiving a clock signal, a reset input connector terminal for receiving a reset signal indicative of reset of the boundary scan LSI, a mode input connector terminal for receiving a mode signal indicative of one of a test mode and a normal mode, and a test result output connector terminal for producing a test result signal indicative of a test result of the boundary scan LSI circuit;

said first through said N-th boundary scan LSI circuits having, as said LSI test terminals, first through N-th test input LSI terminals for receiving the test pattern signal, first through N-th clock input LSI terminals for receiving the clock signal, first through N-th reset input LSI terminals for receiving the reset signal, first through N-th mode input LSI terminals for receiving the mode signal, and first through N-th test result output LSI terminals for producing the test result signal, respectively; and said test conductive patterns comprising a first test input conductive pattern for connecting the test input connector terminal with the first test input LSI terminal, an n-th test input conductive pattern for connecting an (n-1)-th test result output LSI terminal with the n-th test input LSI terminal where n represents each of two through N, a clock conductive pattern for connecting the first through the N-th clock input connector terminals with the first through the N-th clock input LSI terminals, respectively, a reset conductive pattern for connecting the first through the N-th reset input connector terminals with the first through the N-th reset input LSI terminals, respectively, a mode conductive pattern for connecting the first through the N-th mode input connector terminals with the first through the N-th mode input LSI terminals, respectively, and a test output conductive pattern for connecting the test result output connector terminal with the N-th test result output LSI terminal.

9. A multi-layer digital circuit board as claimed in claim 6, wherein said LSI circuits are first through N-th unboundary scan LSI circuits each of which does not contain a boundary scan test logic circuit, where N represents a natural number which is not less than two.

10. A multi-layer digital circuit board as claimed in claim 9, wherein said circuit mounting section further mounts a parallel-serial converter on the circuit upper face thereof, the parallel-serial converter having input converter terminals and an output converter terminal;

said connector test terminals including a input connector terminal for receiving a test pattern signal for use in testing the first through the N-th unboundary scan LSI circuits and an output connector terminal connected to the output converter terminal;

said circuit mounting section having a plurality of additional through holes which have ends connected to the input converter terminals and another ends which reach to the circuit back face;

said first through said N-th unboundary scan LSI circuits having, as said LSI test terminals, first through N-th test input terminals connected to the input connector terminal and first through N-th test output terminal groups for producing first through N-th resultant data indicative of first through N-th test results of the first through the N-th unboundary scan LSI circuits, respectively, each of said first through said N-th test output terminal groups comprising a plurality of test output terminals; and said test conductive patterns comprising resultant signal patterns connecting the input converter terminals with the first through the N-th test output terminal groups via the additional through holes.

11. A multi-layer digital circuit board as claimed in claim 6, wherein said LSI circuits comprise a boundary scan LSI circuit containing a boundary scan test logic circuit and an unboundary scan LSI circuit without a boundary scan test logic circuit.

12. A multi-layer digital circuit board as claimed in claim 11, wherein said test pattern section comprises first and second test pattern layers which are in contact with each other, said conductive patterns comprising boundary scan conductive patterns and unboundary scan conductive patterns, said boundary scan conductive patterns being formed on said first test pattern layer, said unboundary scan conductive patterns being formed on said second test pattern layer, said LSI test terminals comprising boundary scan LSI test terminals for use in testing the boundary scan LSI circuit and unboundary scan LSI test terminals for use in testing the unboundary scan LSI circuit, the boundary scan conductive patterns connecting the boundary scan LSI test terminals with the connector test terminals via the terminal through holes, the unboundary scan conductive patterns being connected to the unboundary scan LSI test terminals.

13. A multi-layer digital circuit board as claimed in claim 12, wherein said circuit mounting section further mounting a parallel-serial converter on the circuit upper face thereof, the parallel-serial converter having input converter terminals and an output converter terminal, said circuit mounting section having a plurality of additional through holes which have ends connected to the input converter terminals and another ends which reach to the circuit back face;

said connector test terminals comprising a test input connector terminal for receiving a test pattern signal for use in testing the boundary scan LSI circuit, a clock input connector terminal for receiving a clock signal, a reset input connector terminal for receiving a reset signal indicative of reset of the boundary scan LSI, a mode input connector terminal for receiving a mode signal indicative of one of a test mode and a normal mode, a test result output connector terminal for producing a test result signal indicative of a test result of the boundary scan LSI circuit, and an output connector terminal connected to the output converter terminal said boundary scan LSI test terminals comprising a test input LSI terminal for receiving the test pattern signal, a clock input LSI terminal for receiving the clock signal, a reset input LSI terminal for receiving the reset signal, a mode input LSI terminal for receiving the mode signal, and a test result output LSI terminal for producing the test result signal;

said boundary scan test conductive pattern comprising a test input conductive pattern for connecting the test input connector terminal with the test input LSI terminal, a clock conductive pattern for connecting the clock input connector terminal with the clock input LSI terminal, a reset conductive pattern for connecting the reset input connector terminal with the reset input LSI terminal, a mode conductive pattern for connecting the mode input connector terminal with the mod input LSI terminal, and a test output conductive pattern for connecting the test result output connector terminal with the test result output LSI terminal;

said unboundary scan LSI test terminals comprising a test input terminal connected to the result output LSI terminal and test output terminals for producing resultant signals indicative of a test result of the unboundary scan LSI circuit; and said unboundary scan test conductive pattern comprising resultant signal patterns connecting the input converter terminals with the test output terminals via the additional through holes.

14. A multi-layer digital circuit board as claimed in claim 6, wherein said LSI circuits comprise first through M-th boundary scan LSI circuits each containing a boundary scan test logic circuit and first through N-th unboundary scan LSI circuits each of which does not contain a boundary scan test logic circuit, where M and N represent natural numbers each of which is not less than two.

15. A multi-layer digital circuit board as claimed in claim 14, wherein said test pattern section comprises first and second test pattern layers which are in contact with each other, said test conductive patterns comprising boundary scan test conductive patterns and unboundary scan test conductive patterns, said boundary scan test conductive patterns being formed on said first test patter layer, said unboundary scan test conductive patterns being formed on said second test pattern layer, said LSI test terminals comprising boundary scan LSI test terminals for use in testing the first through the M-th boundary scan LSI circuits and unboundary scan LSI test terminals for use in testing the first through the N-th unboundary scan LSI circuits, the boundary scan conductive patterns connecting the boundary scan LSI test terminals with the connector test terminals via the circuit through holes, the unboundary scan conductive patterns being connected to the unboundary scan LSI test terminals.

16. A multi-layer digital circuit board as claimed in claim 15, wherein said circuit mounting section further mounts a parallel-serial converter on the circuit upper face thereof, the parallel-serial converter having input converter terminals and an output converter terminal, said circuit mounting section having a plurality of additional through holes which have ends connected to the input converter terminals and other ends which reach to the circuit back face;

said connector test terminals comprise a test input connector terminal for receiving a test pattern signal for use in testing the first through the M-th boundary scan LSI circuits and the first through the N-th unboundary scan LSI circuits, a clock input connector terminal for receiving a clock signal, a reset input connector terminal for receiving a reset signal indicative of reset of the first through the M-th boundary scan LSI circuits, a mode input connector terminal for receiving a mode signal indicative of one of a test mode and a normal mode, a test result output connector terminal for producing test result data indicative of a test result of the first though the N-th boundary scan LSI circuits, and an output connector terminal for producing resultant data indicative of a test result of the first through the N-th unboundary scan LSI circuits;

said first through said M-th boundary scan LSI circuits having, as said boundary scan LSI test terminals, first through M-th test input boundary scan LSI terminals for receiving the test pattern signal, first through M-th clock input LSI terminals for receiving the clock signal, first through M-th reset input LSI terminals for receiving the reset signal, first through M-th mode input LSI terminals for receiving the mode signal, and first through M-th test result output LSI terminals for producing the test result data, respectively;

said boundary scan test conductive patterns comprising a first test input conductive pattern for connecting the test input connector terminal with the first test input LSI terminal, an n-th test input conductive pattern for connecting an (n-1)-th test result output LSI terminal with an n-th test input LSI terminal where n represents each of two through M, a clock conductive pattern for connecting the first through the M-th clock input connector terminals with the first through the M-th clock input LSI terminals, respectively, a reset conductive pattern for connecting the first through the M-th reset input connector terminals with the first through the M-th reset input LSI terminals, respectively, a mode conductive pattern for connecting the first through the M-th mode input connector terminals with the first through the M-th mode input LSI terminals, respectively, and a test output conductive pattern for connecting the test result output connector terminal with the M-th test result output LSI terminal;

said first through said N-th unboundary scan LSI circuits having, as said unboundary scan LSI test terminals, first through N-th test input unboundary scan LSI terminals connected to one of the first through the M-th test result output LSI terminals in common and first through N-th test output terminal groups for producing first through N-th resultant data indicative of first through N-th test results of the first through the N-th unboundary scan LSI circuits, respectively, each of said first through said N-th test output terminal groups comprising a plurality of test output terminals; and said unboundary scan test conductive patterns comprising resultant signal patterns connecting the input converter terminals with the first through the N-th test output terminal groups via the additional through holes.

* * * * *